(12) United States Patent
Yamashita

(10) Patent No.: US 6,949,420 B1
(45) Date of Patent: Sep. 27, 2005

(54) SILICON-ON-INSULATOR (SOI) SUBSTRATE HAVING DUAL SURFACE CRYSTALLOGRAPHIC ORIENTATIONS AND METHOD OF FORMING SAME

(75) Inventor: Tenko Yamashita, Somers, NY (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 10/800,348

(22) Filed: Mar. 12, 2004

(51) Int. Cl.$^7$ .......................... H01L 21/00; H01L 21/84
(52) U.S. Cl. ...................... 438/149; 438/311; 438/168
(58) Field of Search ..................... 438/149, 311, 168, 438/187–188

(56) References Cited

U.S. PATENT DOCUMENTS

| | | | |
|---|---|---|---|
| 5,841,170 A | 11/1998 | Adan et al. | 257/345 |
| 6,391,692 B1 | 5/2002 | Nakamura | 438/151 |
| 6,476,445 B1 | 11/2002 | Brown et al. | 257/347 |
| 6,503,813 B1 | 1/2003 | Koburger, III | 438/424 |
| 6,531,754 B1 * | 3/2003 | Nagano et al. | 257/510 |
| 6,559,035 B2 | 5/2003 | Villa et al. | 438/481 |
| 6,566,712 B2 | 5/2003 | Hayashi et al. | 257/347 |
| 6,593,173 B1 | 7/2003 | Anc et al. | 438/149 |
| 6,627,505 B2 | 9/2003 | Adan | 438/311 |
| 6,649,455 B2 | 11/2003 | Murakami | 438/149 |
| 6,724,046 B2 * | 4/2004 | Oyamatsu | 257/347 |
| 6,835,981 B2 * | 12/2004 | Yamada et al. | 257/347 |
| 2004/0075141 A1 * | 4/2004 | Maeda et al. | 257/347 |

OTHER PUBLICATIONS

Momose, H.S. et al., "*1.5-nm Gate Oxide CMOS on (110) Surface-Oriented Si Substrate,*" IEEE Transactions On Electron Devices, vol. 50, No. 4, Apr. 2003, pp. 1001-1008.

* cited by examiner

*Primary Examiner*—Phat X. Cao
*Assistant Examiner*—Theresa T Doan
(74) *Attorney, Agent, or Firm*—Mayer Fortkort & Williams PC; Stuart H. Mayer, Esq.

(57) ABSTRACT

A method is provided of forming a silicon-on-insulator (SOI) substrate having at least two exposed surface crystal orientations. The method begins by providing an SOI substrate having a first silicon layer with a surface having a first crystal orientation located on a first buried oxide layer. The buried oxide layer is located on a silicon substrate having a surface with a second crystal orientation. The first silicon layer and the first buried oxide layer are selectively removed from a first portion of the SOI substrate to expose a first surface portion of the silicon substrate. A second silicon layer is epitaxially grown over the first surface portion of the silicon substrate. The second silicon layer has a surface with a second crystal orientation. A second buried oxide layer is formed in the second silicon layer. Subsequent to the fabrication of the SOI substrate, N and P type MOSFETS may be formed on the surfaces with different crystal orientations.

16 Claims, 3 Drawing Sheets

SILICON-ON-INSULATOR (SOI) SUBSTRATE HAVING DUAL SURFACE CRYSTALLOGRAPHIC ORIENTATIONS AND METHOD OF FORMING SAME

FIELD OF THE INVENTION

The present invention relates generally to a silicon-on-insulator (SOI) substrate on which a semiconductor device such as a MOSFET can be fabricated, and more particularly to a silicon-on-insulator (SOI) substrate having portions with different surface crystallographic orientations on which a P-MOSFET and an N-MOSFET can be fabricated.

BACKGROUND OF THE INVENTION

According to current processes known in the microelectronics industry, the substrate of integrated devices is typically wafers of monocrystalline silicon. In the last few years, as an alternative to wafers consisting of silicon alone, composite wafers, so-called "SOI" (Silicon-on-Insulator) wafers have been proposed, comprising two silicon layers, one of which is thinner than the other, separated by a silicon oxide layer. SOI structures are becoming widely utilized for construction of electronic devices. For example, such structures can be employed to produce semiconductor devices, such as VLSI devices, micro-electro-mechanical systems (MEMS), and optical devices. One method of producing an SOI structure, known by the acronym SIMOX (separation by implanted oxygen) forms a buried oxide layer (BOX) in a semiconductor substrate by implanting oxygen ions into the substrate followed by a high temperature annealing step. The insulating layer provides electrical isolation of devices that are built in the superficial silicon layer.

Considerable attention has recently been paid to SOI wafers, since integrated circuits having a substrate formed from wafers of this type have considerable advantages compared with similar circuits formed on conventional substrates, formed by monocrystalline silicon alone. These advantages include, faster switching speed, greater immunity to noise, smaller loss currents, elimination of parasitic component activation phenomena, reduction of parasitic capacitance, greater resistance to radiation effects, and greater component packing density.

One particular device formed on an SOI is a MOSFET. In order to meet an increasing demand for high-performance portable equipment, demand for SOI-MOSFETs offering the above-mentioned advantages is also expected to increase. As SOI-MOSFETs continue to be reduced in size, one problem that arises concerns the need to maintain high electron/hole mobility in their channels. Unfortunately, increased MOSFET scaling can degrade mobility in very short channels because of the high impurity levels that are employed to suppress short channel effects and because the parasitic resistance becomes more sensitive. Additionally, mobility saturates at very short channel lengths.

MOSFETs may be classified as P-type, in which the channel is doped P-type, or N-type, in which the channel is doped N-type. For a variety of reasons it is often desirable to incorporate both N-MOSFETs and P-MOSFETs in the same circuit. For example, RF analog circuits such as a low noise amplifier using both types of MOSFETS can be fabricated with enhanced performance characteristics such as higher gain and lower current. It is well known that the hole mobility for a P-MOSFET is much higher when it is formed on a silicon substrate with a top surface having a (110) crystal orientation (an "Si(110) surface or layer") than when it is formed on a silicon substrate with a top surface having a (100) crystal orientation (an "Si(100) surface or layer"). On the other hand, it is also well known that the electron mobility for an N-MOSFET is degraded when it is formed on a Si(110) surface of a substrate in comparison to when it is formed on a Si(100) surface of a substrate. Because of this opposite behavior of electron and hole mobility, it is difficult to integrate an N-MOSFET and a P-MOSFET on the same SOI substrate while maintaining satisfactory performance from both devices.

SUMMARY OF THE INVENTION

In accordance with the present invention, a method is provided of forming an SOI substrate having at least two exposed surface crystal orientations. The method begins by providing an SOI substrate having a first silicon layer with a surface having a first crystal orientation located on a first buried oxide layer. The buried oxide layer is located on a silicon substrate having a surface with a second crystal orientation. The first silicon layer and the first buried oxide layer are selectively removed from a first portion of the SOI substrate to expose a first surface portion of the silicon substrate. A second silicon layer is epitaxially grown over the first surface portion of the silicon substrate. The second silicon layer has a surface with a second crystal orientation. A second buried oxide layer is formed in the second silicon layer.

In accordance with one aspect of the invention, the first silicon layer and the first buried oxide layer are removed by providing a hard mask over the first silicon layer, providing a photoresist pattern on the hard mask, and etching portions of the first silicon layer and the buried oxide layer that are not covered by the photoresist. Finally, the photoresist is removed.

In accordance with another aspect of the invention, the hard mask comprises $Si_3N_4$.

In accordance with another aspect of the invention, the step of forming the second buried oxide layer includes the steps of implanting oxygen ions into the second silicon layer and annealing the SOI substrate.

In accordance with another aspect of the invention, the first crystal orientation is a (110) orientation and the second crystal orientation is a (100) orientation.

In accordance with another aspect of the invention, the first crystal orientation is a (100) orientation and the second crystal orientation is a (110) orientation.

In accordance with another aspect of the invention, an SOI substrate is provided. The SOI substrate includes a silicon substrate having a surface with a first crystal orientation and first and second buried oxide layers each extending over and in contact with different portions of the silicon substrate surface. First and second silicon layers are located over the first and second buried oxide layers, respectively. The first and second silicon layers have surfaces with different crystal orientations, one which is the first crystal orientation.

DETAILED DESCRIPTION

FIGS. 1–5 show a process flow for fabricating a dual plane SOI substrate in accordance with the present invention. The process begins in FIG. 1 with a conventional, commercially available SOI substrate 100. The SOI substrate 100 includes a Si(100) layer 102 having a thickness, for instance, of between about 20–70 angstroms. The Si(110) layer 102 is formed on a buried oxide ("BOX") layer 104, the thickness of which is generally about 150 nm. Box layers are generally employed as isolation structures to electrically isolate semiconductor devices from one another. BOX layer 104 is formed on the (100) surface of a silicon support substrate or wafer 106.

Figure 1:
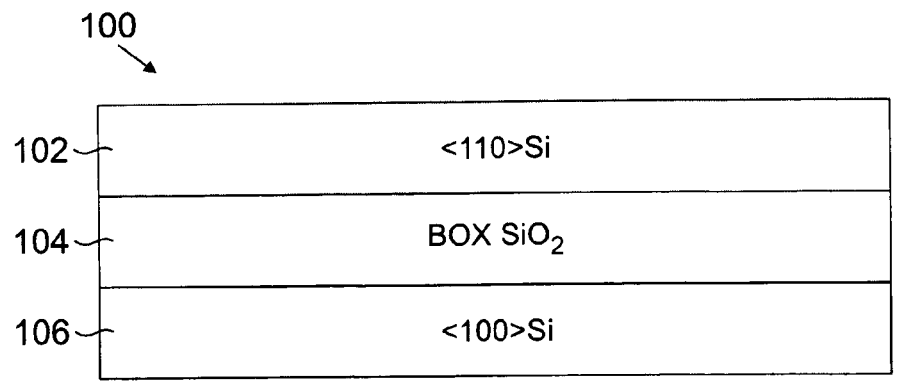
FIGS. 1–5 show a process flow for fabricating a dual plane SOI substrate in accordance with the present invention.
Figure 2:
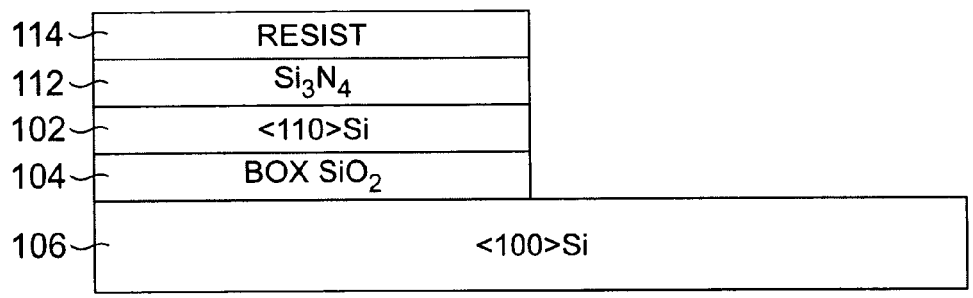

As shown in FIG. 2, a photomasking and lithographic process is used to define the two regions of the SOI substrate 100 surface on which the N and P MOSFETs will be respectively formed. In particular, a hard mask 112 of etchable material such as silicon nitride ($Si_3N_4$) is applied to the Si(110) layer 102. A layer of photoresist 114 is deposited on the hard mask 112 and then patterned for protecting selected areas of the mask. After exposing the photoresist to radiation (typically ultraviolet radiation) to pattern the hard mask, the portion of hard mask 112 unprotected by the photoresist layer 114 is etched to remove the hard mask 112, Si(110) layer 102, and BOX layer 104. The etching step preferably may be performed by a dry etching process such as reactive ion etching (RIE). At the completion of the etch process in FIG. 2, the surface of the Si(100) substrate 106 is exposed over that portion of dual plane SOI substrate on which the N-MOSFET will be formed.

Figure 3:
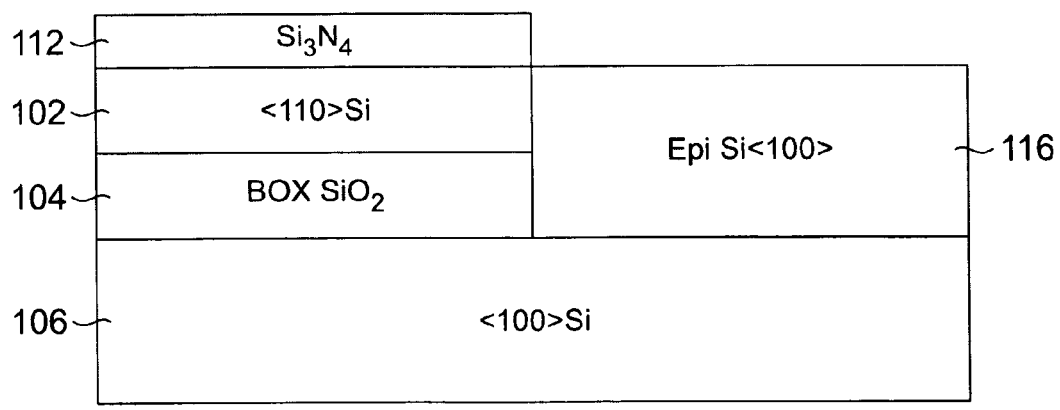

Next, in FIG. 3 an epitaxial layer 116 of silicon is grown on the Si(100) substrate 106. As is well known to those of ordinary skill in the art, when silicon is deposited on an Si(100) surface in an epitaxial manner by any of a variety of growth techniques, the newly deposited silicon will continue to grow with a (100) surface orientation. Accordingly, as indicated in FIG. 3, epitaxial layer 116 will have a (100) surface orientation. Epitaxial layer 116 will preferably be sufficiently thick so that its upper surface is coplanar with the upper surface of Si(110) layer 102. Hard mask 112 prevents the silicon from being deposited on the Si(110) layer 102.

Figure 4:
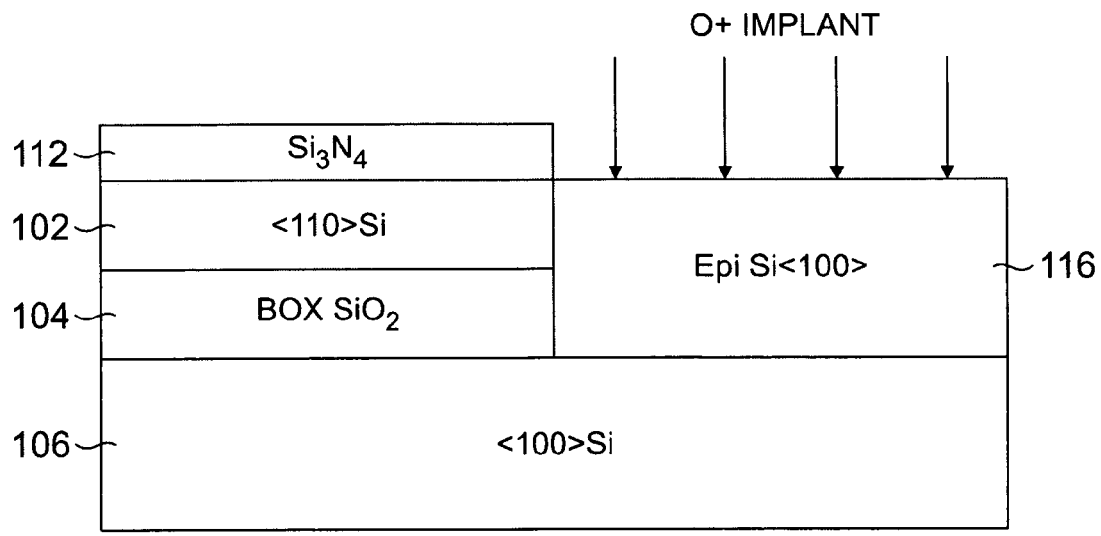

Next, as shown in FIG. 4, oxygen ions are implanted through the Si(100) layer 116. Ion implantation, as used herein, refers to a process whereby a selected dose of oxygen ions is deposited at a particular depth by utilizing one or more of a number of different techniques. Such techniques can include, but are not limited to, exposing the substrate to a beam of ions, plasma immersion techniques, etc. The ion beam has an energy selected to be in a range of about 100 keV to about 150 keV. Further, the dose of the oxygen ions implanted in the wafer is selected to be in a range of approximately 1 e16 ions/$cm^2$.

Figure 5:
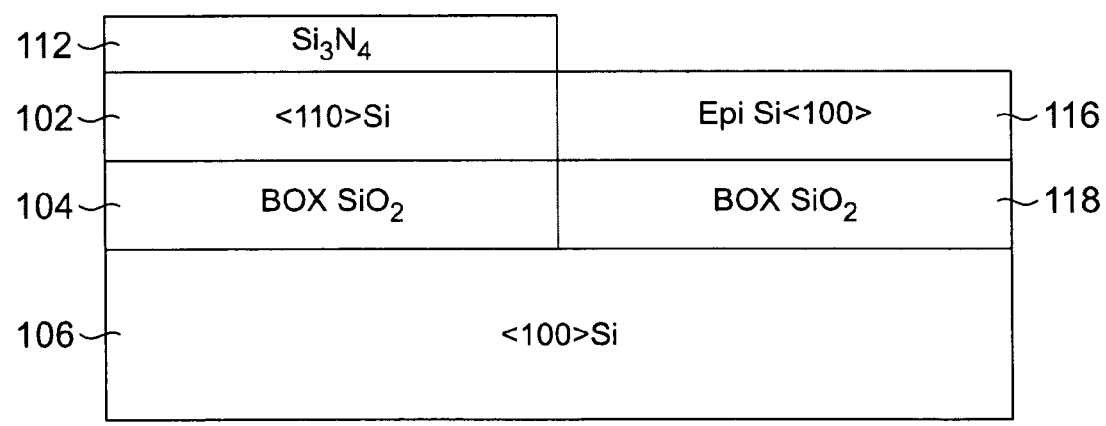

An annealing step follows the oxygen implantation step. The annealing step can be performed at a temperature in a range between approximately 1100 C. The annealing step redistributes the implanted oxygen ions and chemically bonds them to silicon to form a continuous buried layer 118 of silicon dioxide ($SiO_2$), i.e., BOX region, thereby separating an upper silicon layer 116, on the surface of which semiconductor devices are to be manufactured, from the remaining bulk silicon region 106 below. The BOX region has a thickness in a range of approximately 100 to 150 nm. As FIG. 5 shows, BOX layers 104 and 118 will preferably be about equal in thickness and located at the same depth with the structure.

Finally, hard mask 112 is removed to expose the Si(110) surface on which the P-MOSFET device is fabricated.

The resulting dual plane SOI substrate has two exposed silicon surfaces, one with a (110) surface orientation and the other with a (100) surface orientation. The exposed silicon surfaces 102 and 116 are formed on respective BOX layers 104 and 118 that are located on the Si(100) support substrate 106.

Figure 6:
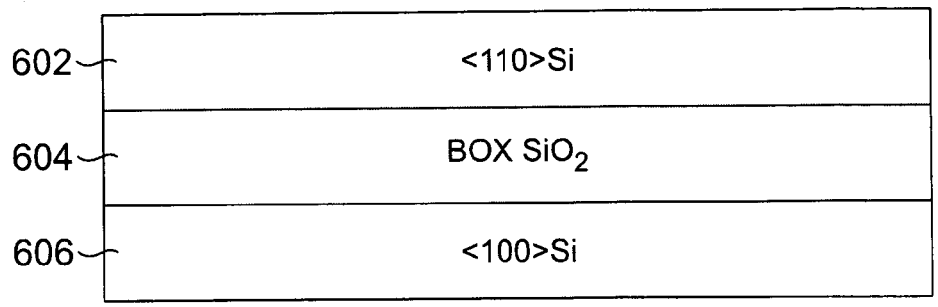
FIG. 6 shows one alternative embodiment of the initial SOI substrate that may be employed in the process flow depicted in FIGS. 1–5.

In one alternative embodiment of the invention, the SOI substrate 100 may be replaced with SOI substrate 600 shown in FIG. 6, which substrate 600 is also commercially available. The SOI substrate 600 includes a Si(100) layer 602 having a thickness, for instance, of between about 20–70 angstroms. The Si(100) layer 602 is formed on a buried oxide ("BOX") layer 604. BOX layer 604 is formed on a Si(110) silicon substrate 606. That is, the location and roles and the Si(110) and the Si(100) layers are reversed in substrate 600 relative to substrate 100. In this case the epitaxial silicon layer that is subsequently grown (i.e., layer 116 in FIG. 3) will be a Si(100) silicon layer.

Figure 7:
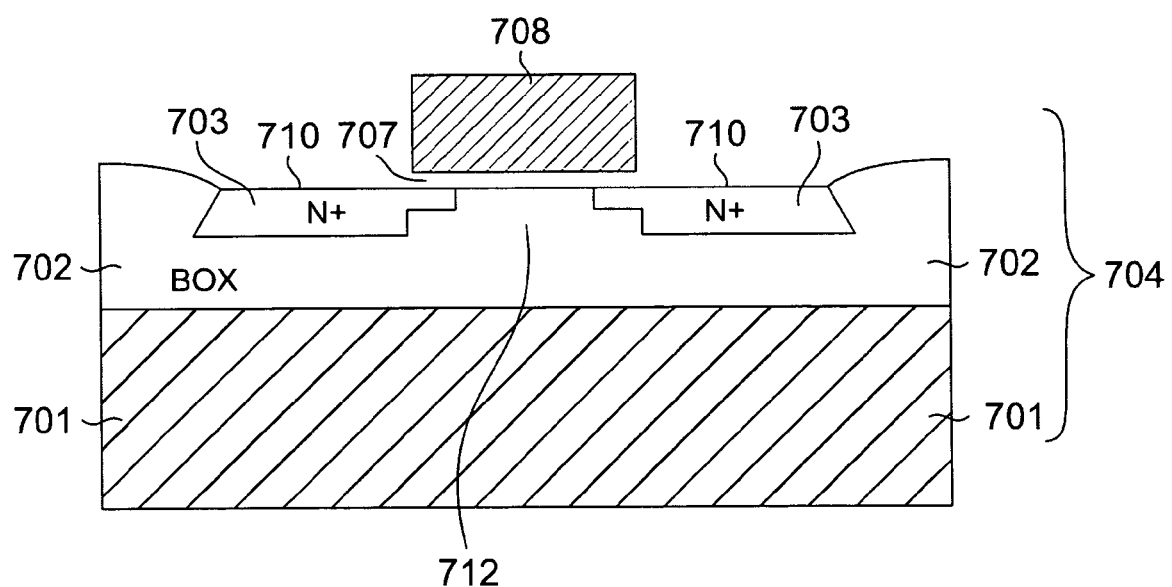
FIG. 7 shows an exemplary P-MOSFET that may be formed on the Si(110) surface portion of the dual plane SOI substrate constructed in accordance with the principles of the present invention.

FIG. 7 shows an exemplary P-MOSFET that may be formed on the Si(110) surface portion of the inventive dual plane SOI substrate. As shown, N-type source/drain regions 710 are formed in a top silicon layer 703 of a SOI substrate 704 which is composed of a silicon substrate 701, the BOX layer 702 and the top silicon layer 703. A gate electrode 708 is formed on the top silicon layer 703 between the source/drain regions 710 with intervention of a gate insulating film 707. Under the gate electrode 708, there is formed a p-type channel region 712. The N-type MOSFET that is formed on the Si(110) surface portion of the inventive dual plane substrate may be similar to that depicted in FIG. 7, but with the impurity conductivities reversed. The N- and P-MOSFETS may be fabricated on the inventive dual plane SOI substrate by conventional processing techniques well known to those of ordinary skill in the art.

What is claimed is:

1. A method of forming an SOI substrate having at least two exposed surface crystal orientations, said method comprising:

provising an SOI substrate having a first silicon layer with a surface having a first crystal orientation located on a first buried oxide layer, said buried oxide layer being located on a silicon substrate having a surface with a second crystal orientation;

selectively removing the first silicon layer and the first buried oxide layer from a first portion of the SOI substrate to expose a first surface portion of the silicon substrate;

epitaxially growing a second silicon layer over the first surface portion of the silicon substrate, said second silicon layer having a surface with a second crystal orientation; and forming a second buried oxide layer in the second silicon layer.

2. The method of claim 1 wherein the selectively removing step comprises the steps of:

providing a hard mask over the first silicon layer;

providing a photoresist pattern on the hard mask; and etching portions of the first silicon layer and the buried oxide layer not covered by said photoresist, and removing said photoresist.

3. The method of claim 2 wherein said hard mask comprises $Si_3N_4$.

4. The method of claim 1 wherein the step of forming the second buried oxide layer comprises the steps of implanting oxygen ions into the second silicon layer and annealing the SOI substrate.

5. The method of claim 1 wherein the first crystal orientation is a (110) orientation and the second crystal orientation is a (100) orientation.

6. The method of claim 1 wherein the first crystal orientation is a (100) orientation and the second crystal orientation is a (110) orientation.

7. An SOI substrate constructed in accordance with the method of claim 1.

8. A method of forming a least two semiconductor devices on a common dual plane SOI substrate having at least two exposed surface crystal orientations, said method comprising:
   A. fabricating the dual plane SOI substrate by:
      i. providing an SOI substrate having a first silicon layer with a surface having a first crystal orientation located on a first buried oxide layer, said buried oxide layer being located on a silicon substrate having a surface with a second crystal orientation;
      ii. selectively removing the first silicon layer and the first buried oxide layer from a first portion of the SOI substrate to expose a first surface portion of the silicon substrate;
      iii. epitaxially growing a second silicon layer over the first surface portion of the silicon substrate, said second silicon layer having a surface with a second crystal orientation; and
      iv. forming a second buried oxide layer in the second silicon layer;
   B. fabricating a first semiconductor device on an exposed surface of the first silicon layer; and
   C. fabricating a second semiconductor device on the second silicon layer.

9. The method of claim 8 wherein the first semiconductor device is a P-MOSFET and the second semiconductor device is an N-MOSFET.

10. The method of claim 9 wherein the first crystal orientation is a (110) orientation and the second crystal orientation is a (100) orientation.

11. The method of claim 8 wherein the selectively removing step comprises the steps of:
   providing a hard mask over the first silicon layer;
   providing a photoresist pattern on the hard mask; and
   etching portions of the first silicon layer and the buried oxide layer not covered by said photoresist, and removing said photoresist.

12. The method of claim 11 wherein said hard mask comprises $Si_3N_4$.

13. The method of claim 8 wherein the step of forming the second buried oxide layer comprises the steps of implanting oxygen ions into the second silicon layer and annealing the SOI substrate.

14. The method of claim 8 wherein the first crystal orientation is a (110) orientation and the second crystal orientation is a (100) orientation.

15. The method of claim 8 wherein the first crystal orientation is a (100) orientation and the second crystal orientation is a (110) orientation.

16. A semiconductor device constructed in accordance with the method of claim 8.

* * * * *

UNITED STATES PATENT AND TRADEMARK OFFICE
CERTIFICATE OF CORRECTION

PATENT NO. : 6,949,420 B1
DATED : September 27, 2005
INVENTOR(S) : Tenko Yamashita It is certified that error appears in the above-identified patent and that said Letters Patent is hereby corrected as shown below:

Column 2,
Line 57, after "one" insert -- of --.

Column 3,
Line 35, after "of" insert -- the --.

Signed and Sealed this

Fourth Day of April, 2006

JON W. DUDAS
*Director of the United States Patent and Trademark Office*